United States Patent [19]

Cha

[11] Patent Number: 5,495,452
[45] Date of Patent: Feb. 27, 1996

[54] CIRCUIT FOR CONTROLLING A SELF-REFRESH PERIOD IN A SEMICONDUCTOR MEMORY DEVICE

[75] Inventor: Gi-Won Cha, Kyungki, Rep. of Korea

[73] Assignee: Samsung Electronics Co., Ltd., Suwon, Rep. of Korea

[21] Appl. No.: 274,866

[22] Filed: Jul. 14, 1994

[30] Foreign Application Priority Data

Jul. 14, 1993 [KR] Rep. of Korea .................. 13276/1993

[51] Int. Cl.$^6$ .................................................. G11C 13/00
[52] U.S. Cl. .......................... 365/222; 365/191; 365/233
[58] Field of Search ..................................... 365/222, 233, 365/191

[56] References Cited

U.S. PATENT DOCUMENTS

| | | | |
|---|---|---|---|
| 5,337,282 | 8/1994 | Koike ........................................ | 365/222 |
| 5,343,430 | 8/1994 | Furuyama ............................. | 365/222 X |
| 5,349,562 | 9/1994 | Tanizaki ................................... | 365/222 |
| 5,365,487 | 11/1994 | Patel et al. .......................... | 365/222 X |

*Primary Examiner*—Do Hyun Yoo
*Attorney, Agent, or Firm*—Robert A. Westerlund; Stephen R. Whitt; Charles R. Donohoe

[57] ABSTRACT

A circuit which controls a self-refresh period of a semiconductor memory device includes a pulse generating circuit which outputs a periodic pulse train in response to an external control signal, a frequency-dividing circuit which outputs a plurality of pulse trains having different respective periods by frequency-dividing the pulse train, at least one temperature detector which detects an ambient temperature of the memory device and outputs a temperature detection signal when the ambient temperature exceeds a predetermined threshold level, at least one voltage detecting circuit which detects a power supply voltage applied to the memory device and outputs a voltage detection signal when the power supply voltage reaches a predetermined level, a combination pulse train generating circuit which outputs a plurality of combination pulse trains by variously combining the plurality of pulse trains output by the frequency-dividing circuit, and a pulse selecting circuit which outputs a self-refresh master clock by selecting one of the combination pulse trains in response to the voltage detection signal and the temperature detection signal.

4 Claims, 8 Drawing Sheets

CIRCUIT FOR CONTROLLING A SELF-REFRESH PERIOD IN A SEMICONDUCTOR MEMORY DEVICE

BACKGROUND OF THE INVENTION

The present invention relates to a semiconductor memory device, and more particularly to a circuit for controlling a self-refresh period to determine the period of the self-refresh operation in the semiconductor memory device.

Generally, the refresh operation should be continuously performed during the stand-by mode of the memory device that requires the refresh operation to keep data stored in the memory cell of a DRAM device (DRAM: Dynamic Random Access Memory). The refresh operation used for such an object is called "self-refresh". Recently, the power supply voltage of the memory device lowers, so that a current consumption therein must be reduced. Accordingly, the self-refresh operation should be performed with the minimum current consumption. In order to reduce the current consumption for the self-refresh operation, it is desirous to perform the self-refresh operation with the longest period as long as the data retention time of the memory cell in the memory device is satisfied. According to this fact, the period control circuit for the self-refresh operation that can program the period of the refresh operation up to an optimum level is widely used. The period of the self-refresh operation is determined by selecting a pulse train having the longest period to satisfy a data retention time among a number of pulse trains output from a timer as a master clock, after measuring the data retention time of the memory cell in the memory device. The preferred embodiment of such an art is disclosed in detail in Korea patent application No. 93-10315 filed by the same applicant.

In general, the data retention capability of the memory cell is closely related with the level of a power supply voltage and an ambient temperature. That is, if the power supply voltage lowers or if the ambient temperature rises, the data retention capability of the memory cell is deteriorated. Therefore, the refresh operation should be more frequently performed when the power supply voltage is low. Further, the refresh operation should be more frequently performed when the ambient temperature is high. The period control circuit for controlling the self-refresh operation of which period is variable according to the variation of the ambient temperature, is disclosed in the pages 43 and 44 of a publication entitled "SYMPOSIUM ON VLSI CIRCUITS DIGEST OF TECHNICAL PAPERS" published in 1993. According to such an art, the variation of the ambient temperature is detected by using a polysilicon resistor and a well resistor having different resistance-temperature coefficients from each other, and a differential amplifier that is capable of sensing the voltage difference generated between the polysilicon resistor and the well resistor. Further, according to the above mentioned fact, the period of the self-refresh operation is controlled by selecting one of the timers which output predetermined different period pulse trains suitable for the level of the ambient temperature.

However, even if the conventional self-refresh period control circuit controls the period of the refresh operation responding to the ambient temperature of the memory device, the circuit can't control the period of refresh operation responding to the variation of the power supply voltage provided to the memory device.

In addition, the conventional self-refresh period control circuit has the problem that it is difficult to obtain the master clock having a period which approximates to the data retention time of the memory cell. That is, after the conventional timer circuit generates a number of pulse trains having different periods from each other(for example, 2 μs, 4 μs, ... 128 μs, 256 μs) by frequency-dividing the pulse train output from an oscillator, the timer circuit selects one of the pulse trains as the self-refresh master clock. Since each pulse train has the relationship of the frequency-dividing, the timer circuit can't select a specific pulse train having an appropriate period between any one period and the next period(for example, between the 128 μs and the 256 μs) as the master clock. Further, to form the pulse train having the appropriate period, even if the specific period can be selected as the master clock, another complicated timer circuit is necessitated in the conventional art.

SUMMARY OF THE INVENTION

It is therefore an object of the present invention to provide a period control circuit for a self-refresh operation in a semiconductor memory device which reduces a current consumption by optimizing the period of the self-refresh operation.

It is another object of the present invention to provide a period control circuit for a self-refresh operation in a semiconductor memory device, wherein the period of a self-refresh operation is automatically varied according to variations of an ambient temperature of the memory device and a power supply voltage provided thereto.

It is still another object of the present invention to provide a period control circuit for a self-refresh operation in a semiconductor memory device which can optimize the period of a refresh operation to approximate to a data retention time of the memory cell.

To achieve these objects, the period control circuit for the self-refresh operation disclosed in the present invention includes pulse generating means for outputting a predetermined periodic pulse train responding to an external control signal; frequency-dividing means for outputting a number of pulse trains which have different periods from each other by frequency-dividing said pulse train output from said pulse generating means; at least one temperature detecting means for outputting a temperature detection signal by detecting that the ambient temperature of said memory device reaches at a predetermined level; at least one voltage detecting means for outputting a voltage detection signal by detecting that the power supply voltage applied to said memory device reaches at a predetermined level; combination pulse train generating means for outputting a number of combination pulse trains by combining the said pulse trains output from said frequency-dividing means; and pulse selecting means for outputting a self-refresh master clock by selecting one of said combination pulse trains responding to said voltage detection signal and said temperature detection signal.

BRIEF DESCRIPTION OF THE DRAWINGS

The above and other objects, advantages and features of the present invention will be more apparent from the following detailed description taken with the attached drawings in which:

FIG. 3 is comprised of FIGS. 3A and 3B, in which

FIG. 4 is comprised of FIGS. 4A to 4C, in which

DETAILED DESCRIPTION OF THE PREFERRED EMBODIMENT

In the following description, each detailed circuit, specific data, the number of the pulse trains, and each period of pulse train are used to bring a better understanding of the embodiment of the present invention. Moreover, it is well known to one skilled in the art to realize the present invention without specific and detailed disclosure of the elements.

A term "memory cell" used in the present invention means a dynamic memory cell comprised of one transistor and one capacitor, as well known.

Further, the well resistance represents a sheet resistance of an well region formed on a semiconductor substrate. Also, a polycrystalline silicon(in the following, called "polysilicon" for short) resistance represents the sheet resistance of the polysilicon load formed on the semiconductor substrate.

Figure 1:
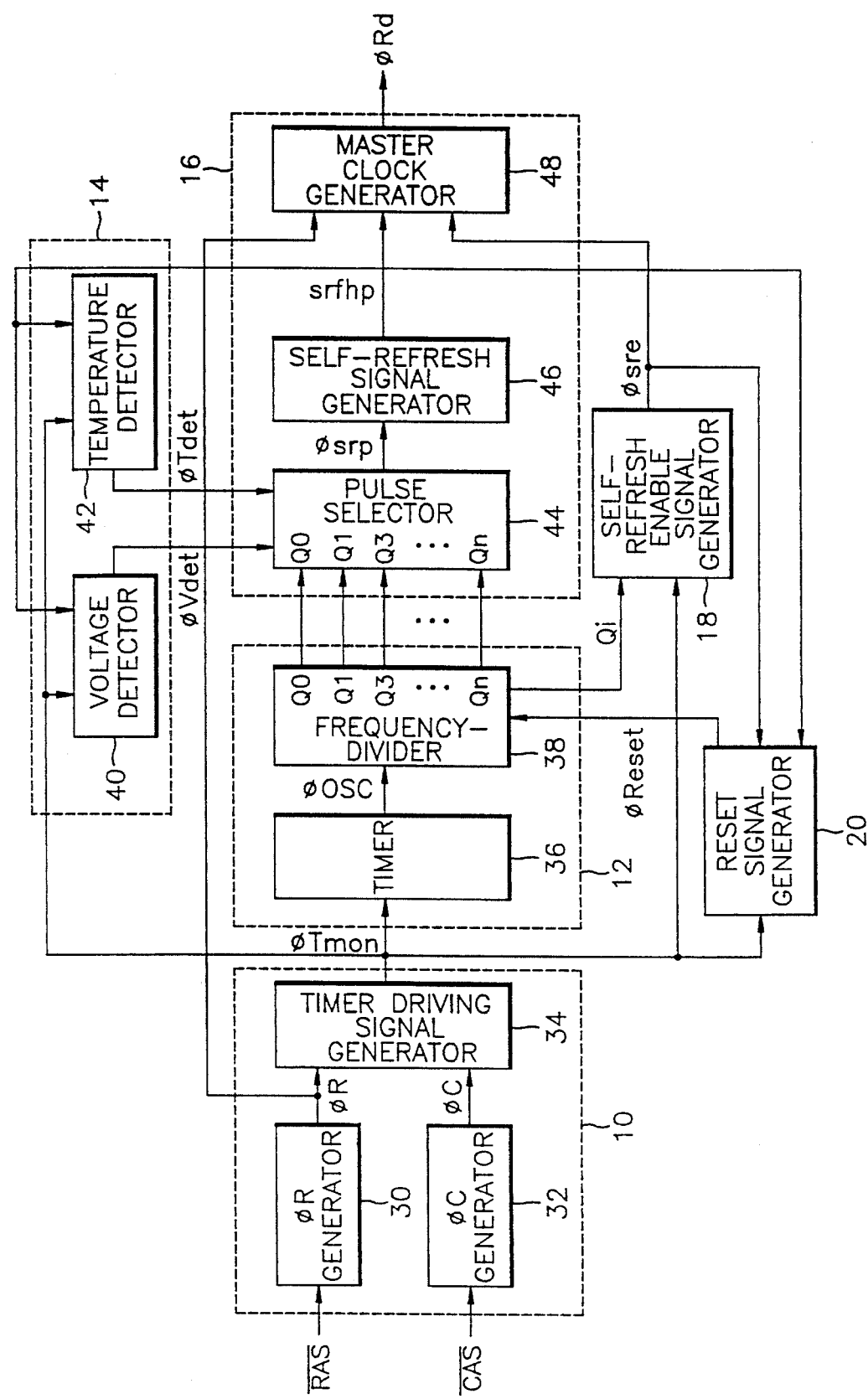
FIG. 1 is a schematic block view showing a period control circuit for a self-refresh operation according to the present invention.

Referring to FIG. 1, a self-refresh period control circuit according to present invention is comprised of the CBR mode ($\overline{CAS}$ Before $\overline{RAS}$ mode) detecting circuit 10 for outputting a timer driving signal $\phi T_{mon}$ to enable the timer responding to the inverse low address strobe signal $\overline{RAS}$ and a inverse column address strobe signal $\overline{CAS}$; the pulse train generating circuit 12 for outputting a number of pulse trains Q0–QN having different periods from each other responding to the timer driving signal $\phi T_{mon}$; a temperature and voltage detecting circuit 14 for outputting a temperature detection signal $\phi$Tdet by detecting that the ambient temperature of the memory device reaches at a predetermined level and a voltage detection signal $\phi$Vdet by detecting that the power supply voltage supplied to the memory device reaches at a predetermined level; a master clock generating circuit 16 for generating the new periodic combination pulse trains by combining the pulse trains output from the pulse train generating circuit 12 and for outputting any one of the new periodic combination pulse trains as a master clock signal $\phi$Rd of the self-refresh operation; a self-refresh enable signal generator 18 for outputting a self-refresh enable signal $\phi$sre permitting a generation of the master clock signal $\phi$Rd with a predetermined time delay after the timer driving signal $\phi T_{mon}$ is activated; and a reset signal generator 20 for outputting a reset signal $\phi$Reset under a predetermined condition.

FIGS. 2 to 6 are detailed circuit views showing each of blocks included in FIG. 1.

Figure 2:
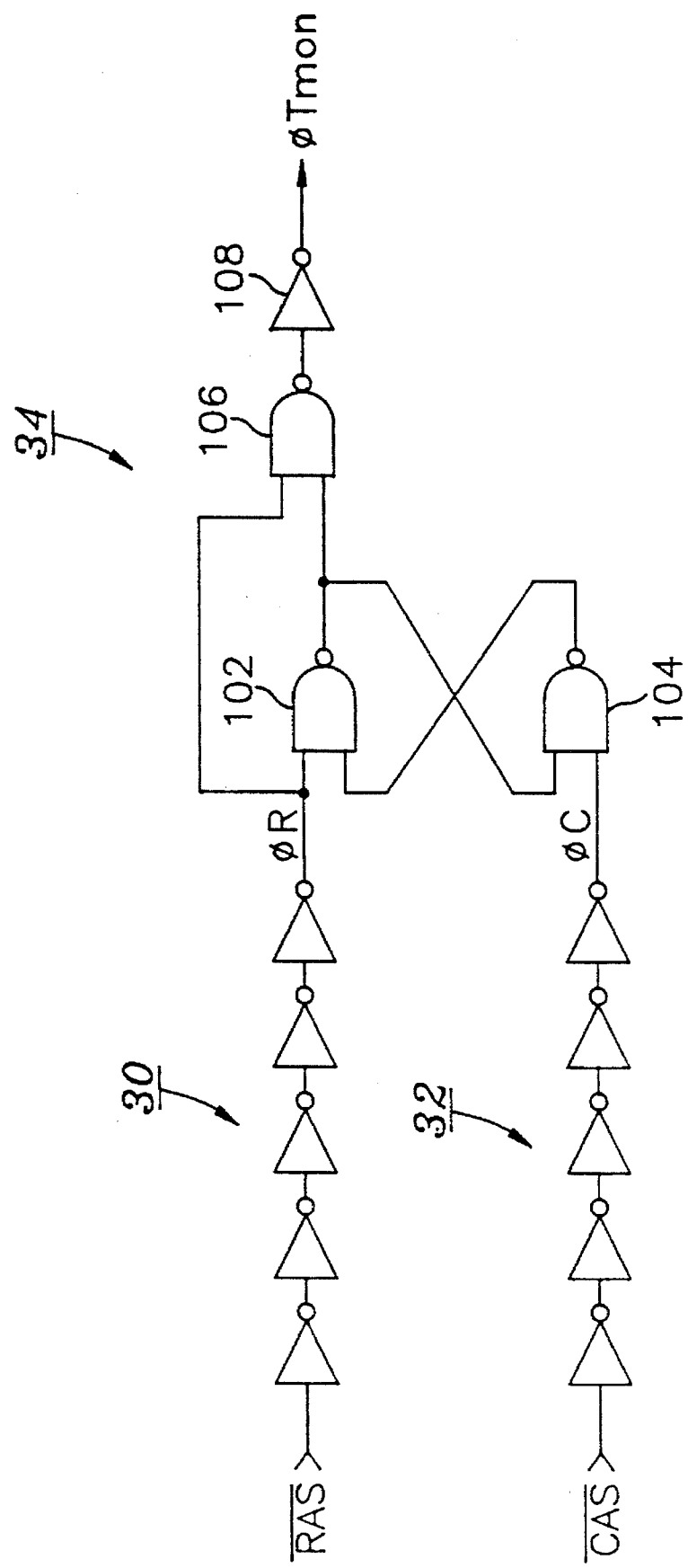
FIG. 2 is a detailed circuit view showing a CBR mode detector shown in FIG. 1.

Referring to FIG. 2, the CBR mode detecting circuit 10 is comprised of a $\phi$R generator 30 having five serially connected inverters which receive the inverse low address strobe signal $\overline{RAS}$ and output the signal $\phi$R; a $\phi$C generator 32 having five serially connected inverters which receive the inverse column address strobe signal $\overline{CAS}$ and output the signal $\phi$C; and a timer driving signal generator 34 which consists of two NAND gates 102 and 104 which receive the signals $\phi$R and $\phi$C as the respective first inputs and receive mutual output signals as the respective second inputs, a NAND gate 106 which receives the signal $\phi$R as the first input and receives the output signal of the NAND gate 102 as the second input, and an inverter 108 for outputting the timer driving signal $\phi T_{mon}$ by inverting the output signal of the NAND gate 106. In FIG. 2, if the signal $\overline{RAS}$ goes to the logic low level (in the following, called "low level" for short) after the signal $\overline{CAS}$ went to the low level, the timer driving signal $\phi T_{mon}$ is output as the logic high level (in the following, called "high level" for short) while the signals $\overline{CAS}$ and $\overline{RAS}$ are kept at the low level.

The pulse train generating circuit 12 for outputting a number of frequency pulse trains Q0–QN having different periods from each other is comprised of a timer 36 and a frequency divider 38.

The timer 36 for outputting the pulse train $\phi$OSC being controlled by the timer driving signal $\phi T_{mon}$ output from the timer driving signal generator 34, uses a current mirror type ring-oscillator which can minimize the influence of an operating voltage and an ambient temperature. The detailed circuit view and the operational characteristics of the current mirror type ring-oscillator is disclosed in pages 45 and 46 of the publication entitled "SYMPOSIUM ON VLSI CIRCUITS DIGEST OF TECHNICAL PAPERS" published in 1987.

Further, the frequency divider 38 which receives the pulse train signal $\phi$OSC output from the timer 36 and outputs a number of the pulse trains Q0–QN having different periods from each other, uses a typical ripple counter, as well known to one skilled in the art. Therefore, the period of pulse train Q0 is two times longer than the period of the $\phi$OSC, and also the period of pulse train Q1 is two times longer than the period of the pulse train Q0. Finally, the period of pulse train QN having the longest period is $2^{N+1}$ times longer than the period of the $\phi$OSC.

Figure 3A:
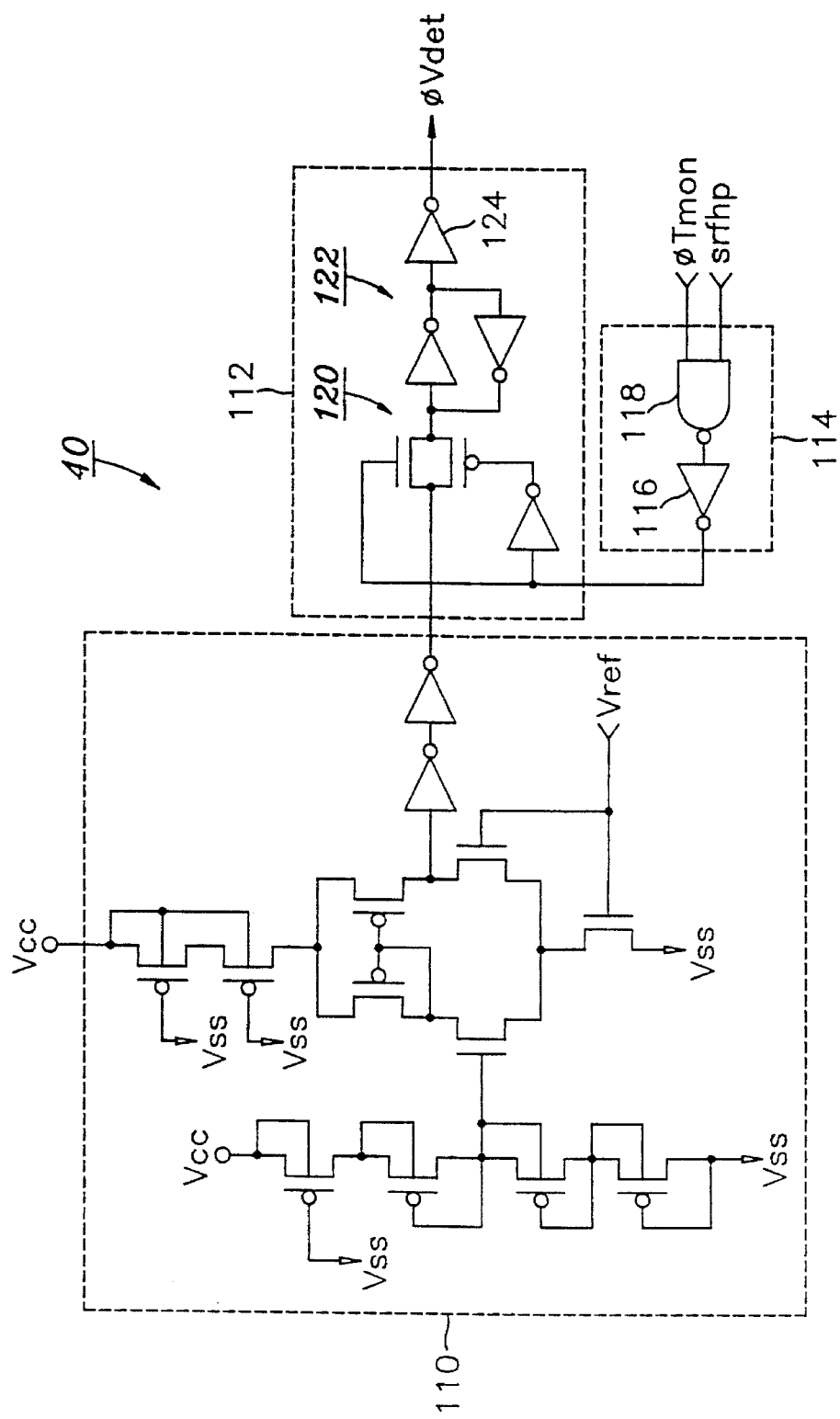
FIG. 3A is a detailed circuit view showing a voltage detector and FIG. 3B is a detailed circuit view showing a temperature detector shown in FIG. 1.

Referring to FIG. 3A, the voltage detector 40 consists of a voltage level detector 110, an output stage 112 and a detection controller 114. When the power voltage applied to the memory device has the higher level than a predetermined detecting voltage Vref, the voltage level detector 110 outputs the voltage detecting signal of the high level. Here, since the operation of voltage level detector 110 is well known in the art, the explanation will be omitted in the detailed description of the present invention. The output stage 112 consists of a CMOS transfer gate 120 transferring the output signal of the voltage level detector 110, a latch 122 for temporarily storing the output of the CMOS transfer gate 120, and an inverter 124 for outputting the voltage detection signal $\phi$Vdet by inverting the output of the latch 122. The detection controller 114 consists of a NAND gate 118 which receives the timer driving signal $\phi T_{mon}$ and a self-refresh signal srfhp (this will be explained in detail in FIG. 4), and an inverter 116 for inverting the output signal of the NAND gate 118. The output signal of the inverter 116 and the inverse output signal of the output of the inverter 116 control an N channel gate and P channel gate of the CMOS transfer gate 120 respectively. Therefore, when the timer driving signal $\phi T_{mon}$ and the self-refresh signal srfhp are kept at the high level, the CMOS transfer gate 120 is turned on, so that the output signal of the voltage level detector 110 is transferred to the output stage 112.

In FIG. 3, if the power supply voltage Vcc is higher than the detecting voltage Vref, the voltage level detector 110 outputs a signal having high level, so that the signal φVdet of the high level is output to the output stage 112 when the output of the detection controller 114 is set to the high level. On the other hand, if the power supply voltage Vcc is lower than the detecting voltage Vref, the voltage level detector 110 outputs a signal of the low level, so that the signal φVdet of the low level is output to the output stage 112 when the output signal of the detection controller 114 is set to the high level. Therefore, whether the power supply voltage provided to the memory device is lower than a predetermined detecting voltage Vref or not, can be detected.

Figure 3B:
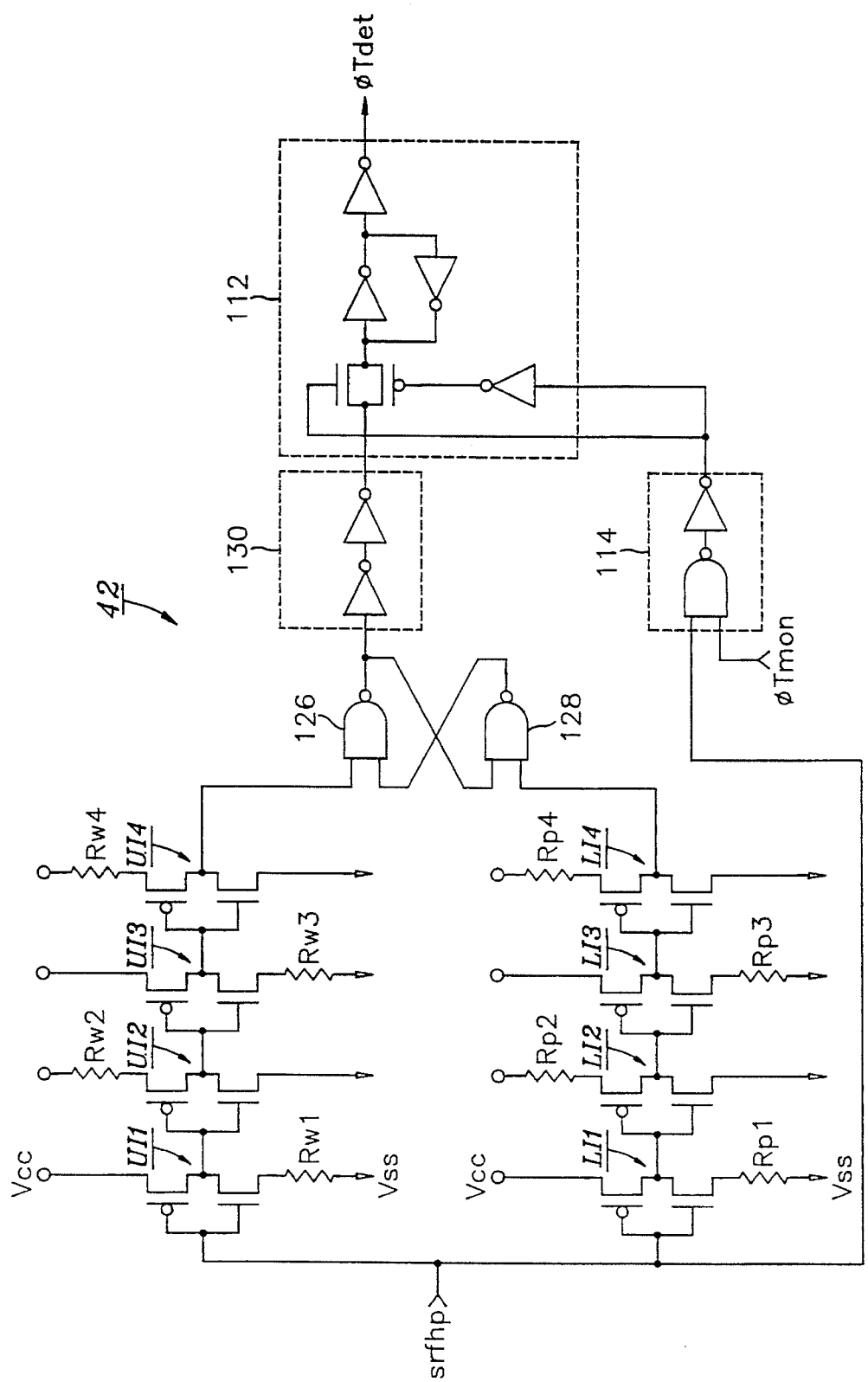

Next, referring to FIG. 3B, the temperature detector 42 consists of two NAND gates 126 and 128 for receiving the self-refresh signal srfhp as the respective first input signals via the four serially connected inverters UI1–UI4 and LI1–LI4, and for receiving the mutual output signal as the respective second input signals, a buffer stage 130 for receiving the output signal of the NAND gate 126, an output stage 112 for receiving the output signal of the buffer stage 130 and for outputting the temperature detection signal φTdet to the output node, and the detection controller 114 for controlling the detecting operation by selectively preventing the output signal of the buffer stage 130 from being transferred to the output stage 112. Since the output stage 112 and the detection controller 114 are the same as that of FIG. 3A, they are represented as the same number, so that the explanation will be omitted, here. The inverters UI1 and UI3 out of the four serially connected inverters UI1–UI4 which transfer the self-refresh signal srfhp to the first input signal of the NAND gate 126, are connected to a ground voltage terminal Vss via the resistors Rw1 and Rw3 respectively, and also the inverters UI2 and UI4 are connected to the power voltage terminal Vcc via the resistors Rw2 and Rw4 respectively. Further, the inverters LI1–LI3 out of the four serially connected inverters LI1–LI4 which transfer the self-refresh signal srfhp to the first input signal of the NAND gate 128, are connected to the ground voltage terminal Vss via the resistors Rp1 and Rp3 respectively, and also, the inverters LI2 and LI4 are connected to the power voltage terminal Vcc via the resistors Rp2 and Rp4 respectively. The resistors Rw1–Rw4 are the well resistors and the resistors Rp1–Rp4 are the polysilicon resistors.

In the following, the UI1–UI4 are called a first inverter group and the LI1–LI4 are called a second inverter group in order to easily explain the embodiment of the present invention.

Generally, as known in the art, the well resistor and poly resistor have temperature-resistance coefficients different from each other. The inventor forms the well resistance and the polysilicon resistance on the same silicon substrate, and then the inventor obtained the result given in Table 1 by measuring the respective sheet resistance.

TABLE 1

| Temperature | polysilicon resistor | well resistor |
| --- | --- | --- |
| 25° C. | 55.0 Ω/□ | 460.0 Ω/□ |
| 45° C. | 56.2 Ω/□ | 514.5 Ω/□ |
| 65° C. | 56.9 Ω/□ | 564.5 Ω/□ |
| 85° C. | 57.7 Ω/□ | 612.6 Ω/□ |
| 105° C. | 60.1 Ω/□ | 671.3 Ω/□ |

As shown in Table 1, the variation ratio of resistance corresponding to the ambient temperature in well resistor is higher than that in the polysilicon resistor.

In FIG. 3B, the well resistors Rw1–Rw4 and the polysilicon resistors Rp1–Rp4 are formed that having a same resistance in the desired detecting temperature. The variation ratio of the well resistors Rw1–Rw4 corresponding to the ambient temperature are higher than those of the polysilicon resistors Rp1–Rp4, so that the difference of the time delay between the first inverter group and the second inverter group is generated. If the ambient temperature is higher than the detecting temperature, the resistances of the well resistors Rw1–Rw4 are higher than those of the polysilicon resistors Rp1–Rp4, thereby the time delay of the first inverter group is longer than that of the second inverter group. Therefore, when the self-refresh signal srfhp goes to the "high" level, the output signal of NAND gate 128 goes to "high" level earlier than the output signal of NAND gate 126, so that the output signal of NAND gate 126 is latched to the "high" level, thus generating the temperature detection signal φTdet of the "high" level. On the contrary, if the ambient temperature is lower than the detecting temperature, the resistances of the well resistors Rw1–Rw4 are lower than those of the polysilicon resistors Rp1–Rp4, thereby the time delay of the first inverter group is shorter than that of second inverter group. Therefore, when the self-refresh signal srfhp goes to the "high" level, the output signal of NAND gate 126 goes to "low" level earlier than the output signal of NAND gate 128, so that the output signal of NAND gate 126 is latched to the "low" level, thus generating the temperature detection signal φTdet of the "low" level. Thus, whether the ambient temperature of the memory device is higher than a predetermined detecting temperature or not, can be detected.

Figure 4A:
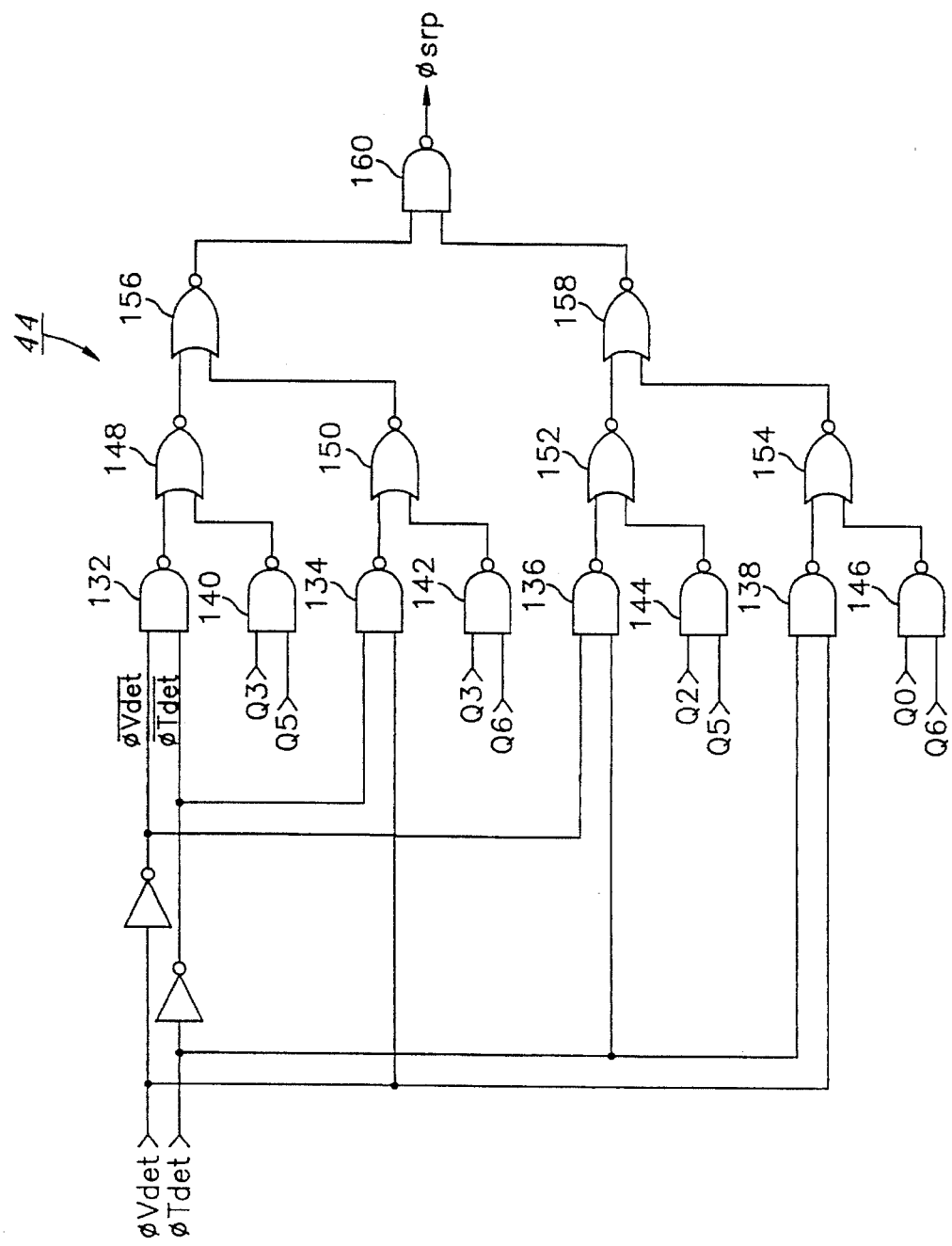
FIG. 4A is a detailed circuit view showing a pulse selector.

Referring to FIG. 4A, the pulse selector 44 consists of NAND gates 132–146, 160 and NOR gates 148–158. A NAND gate 132 receives the inverted voltage detection signal $\overline{\phi Vdet}$ and the inverted temperature detection signal $\overline{\phi Tdet}$, a NAND gate 134 receives the voltage detection signal $\phi Vdet$ and the inverted temperature detection signal $\overline{\phi Tdet}$, a NAND gate 136 receives the inverted voltage detection signal $\overline{\phi Vdet}$ and the temperature detection signal $\phi Tdet$, and a NAND gate 138 receives the voltage detection signal $\phi Vdet$ and the temperature detection signal $\phi Tdet$. A NAND gate 140 receives the pulse trains Q3 and Q5, a NAND gate 142 receives the pulse trains Q3 and Q6, a NAND gate 144 receives the pulse trains Q2 and Q5, and a NAND gate 146 receives the pulse trains Q0 and Q6. A NOR gate 148 receives the output signals of the NAND gates 132 and 140, a NOR gate 150 receives the output signals of the NAND gates 134 and 142, a NOR gate 152 receives the output signals of the NAND gates 136 and 144, and a NOR gate 154 receives the output signals of the NAND gates 138 and 146. A NOR gate 156 receives the output signals of the NOR gates 148 and 150, a NOR gate 158 receives the output signals of the NOR gates 152 and 154. A NAND gate 160 receives the output signals of the NOR gates 156 and 158, to output a signal φsrp.

Figure 4B:
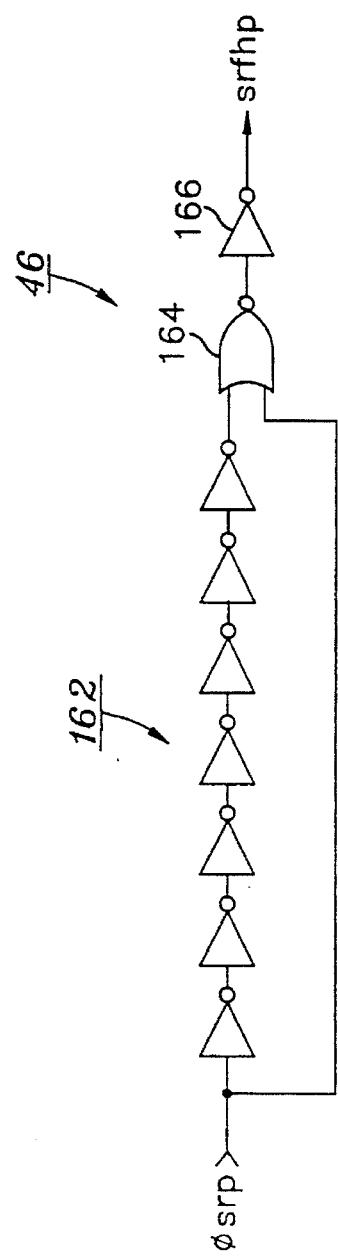
FIG. 4B is a detailed circuit view showing a self-refresh signal generator.

Referring to FIG. 4B, the self-refresh signal generator 46 consists of a NOR gate 164 receiving the signal φsrp as a first input and the signal φsrp, as a second input, inverted and time-delayed by the seven serially connected inverters 162, and a inverter 166 receiving the output signal of NAND gate 164 and outputting the self-refresh signal srfhp. It is preferable that the time delay by the inverter 162 should coincide with the random read or write cycle time $t_{RC}$ of the memory device. Thus, if the signal φsrp goes to the "low" level from the "high" level, the output signal of the NOR gate 164 goes to the "high" level during the random read or write cycle time $t_{RC}$.

Figure 4C:
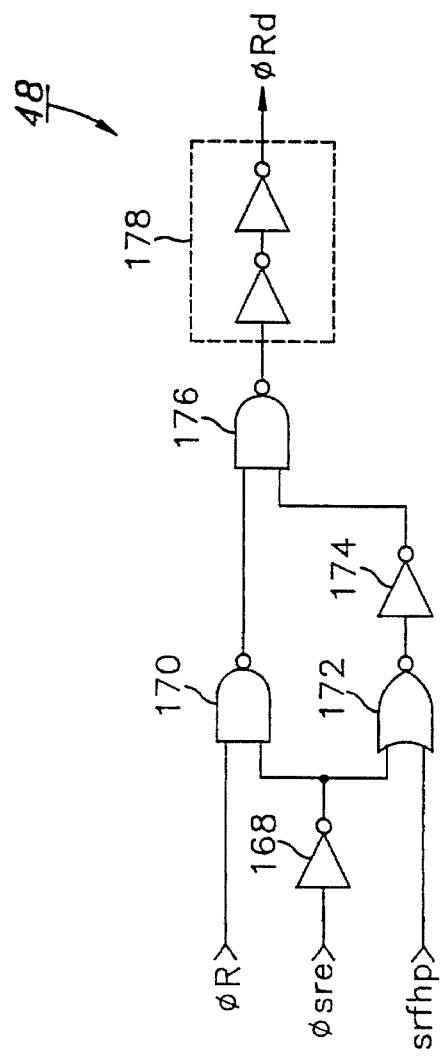
FIG. 4C is a detailed circuit view showing a master clock generator, shown in FIG. 1 respectively.

Referring to FIG. 4C, the master clock generator 48 consists of an inverter 168 for receiving a self-refresh enable signal φsre, a NAND gate 170 for receiving the output signal of the inverter 168 and the signal φR, a NOR gate 172 for receiving the output signal of the inverter 168 and the signal srfhp, an inverter 174 for inverting the output signal of the NOR gate 172, a NAND gate 176 for receiving the output signal of the NAND gate 170 and the output signal of the inverter 174, and an output buffer 178 for outputting the master clock signal φRd by receiving the output signal of the NAND gate 176. In FIG. 4C, when the signal φR and the signal φsre are kept at the "high" level, the master clock signal φRd becomes the inverted signal of the self-refresh signal srfhp. Therefore, the generation of the master clock signal φRd is controlled by the self-refresh enable signal φsre.

Figure 5:
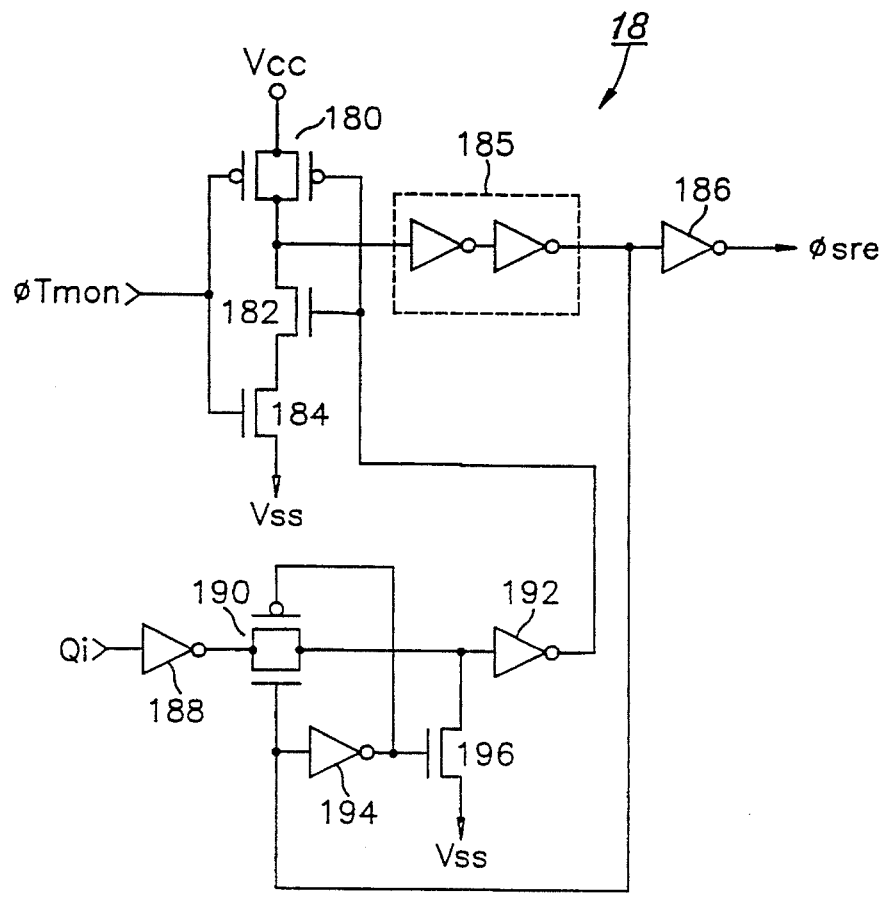
FIG. 5 is a detailed circuit view showing a self-refresh enable signal generator shown in FIG. 1.

FIG. 5 is a detailed circuit view showing the self-refresh enable signal generator 18 shown in FIG. 1. After advancing to the CBR mode, the self-refresh enable signal should be enabled after a lapse of a predetermined time. In FIG. 5, though the timer driving signal $\phi T_{mon}$ changes to the "high" level, if the pulse Qi is not enabled to the "high" level, the self-refresh enable signal φsre is kept at the "low" level. Meanwhile, in this state, if the pulse Qi is enabled to the "high" level, the signal φsre is kept at the "high" level while the signal $\phi T_{mon}$ is kept at the "high" level.

Figure 6:
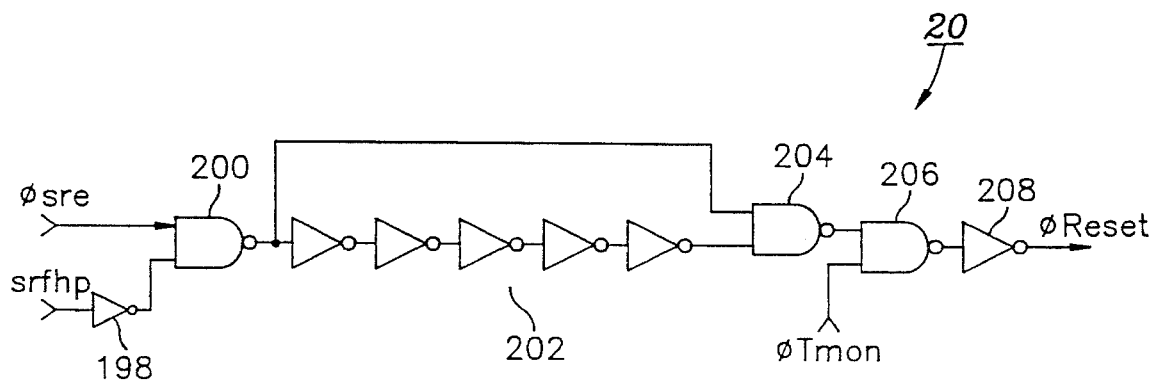
FIG. 6 is a detailed circuit view showing a reset signal generator shown in FIG. 1.

FIG. 6 is a detailed circuit view showing the reset signal generator 20 shown in FIG. 1. The reset signal generator 20 consists of a NAND gate 200 for receiving the self-refresh enable signal φsre as a first input and the self-refresh signal srfhp, as a second input, via an inverter 198, a NAND gate 204 for receiving the output signal of the NAND gate 200 as a first input and the output signal of the NAND gate 200, as a second input, time-delayed and inverted by five serially connected inverters 202, a NAND gate 206 for receiving the output signal of the NAND gate 204 and the timer driving signal $\phi T_{mon}$, and an inverter 208 for outputting the reset signal φReset by inverting the output signal of the NAND gate 206. The timer driving signal $\phi T_{mon}$ inputting to the NAND gate 206 controls the generation of the reset signal. When the timer driving signal φTmon and the signal φsre are kept at the "high" level, if the self-refresh signal srfhp goes to the "low" level, the output signal of the NAND gate 200 becomes the "low" level for the delay time by the inverters 202. The reset signal resets the frequency divider 38.

Figure 7:
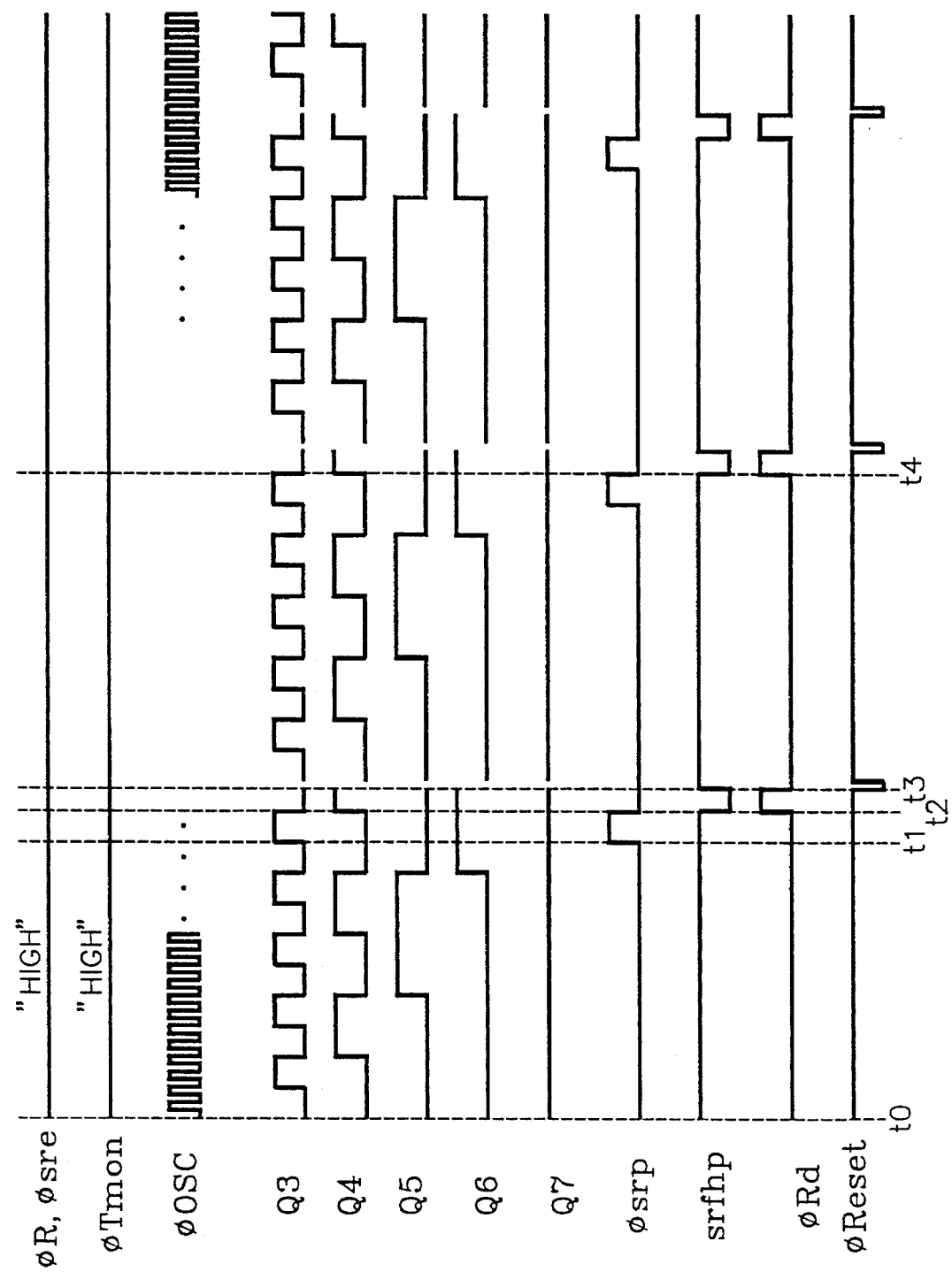
FIG. 7 is an operational timing diagram of FIG. 1.

FIG. 7 shows a timing diagram of the circuit according to the present invention. References will now be made to FIGS. 4 to 7 to bring a better understanding of the period selecting operation of the circuit in FIG. 1.

In the following descriptions, it is assumed for the sake of explanation that a period of the pulse train φOSC supplied from the timer 36 is 2 μsec and the pulse train φOSC is sequentially frequency-divided by the frequency divider 38, thus generating frequency-divided pulse trains Q0–Q7 of which periods are as described in Table 2. It is further assumed that the total number of the rows (i.e., the number of the word lines to be driven) to be refreshed for one refresh cycle is 2,048 and the data retention time of the memory cells according to the voltage level and the temperature level is as described in Table 3. In Table 3, when the voltage supplied to the memory device is lower than a predetermined reference level and the ambient temperature of the memory device is higher than a predetermined reference temperature (i.e., the memory device operates under the worst operating condition), the data retention time of the memory cells is 170 msec, so that 2,048 rows must be completely refreshed within the data retention time of 170 msec. Alternatively, when the voltage supplied to the memory device is higher than the predetermined reference level and the ambient temperature of the memory device is lower than the predetermined reference voltage (i.e., the memory device operates under the best operating condition), the data retention time of the memory cells is 340 msec, so that the memory device must refresh 2,048 rows completely within the data retention time of 340 msec.

TABLE 2

| Pulse Train | Q0 | Q1 | Q2 | Q3 | Q4 | Q5 | Q6 | Q7 |
|---|---|---|---|---|---|---|---|---|
| Period | 4 μs | 8 μs | 16 μs | 32 μs | 64 μs | 128 μs | 256 μs | 512 μs |

TABLE 3

| | Case 1 | Case 2 | Case 3 | Case 4 |
|---|---|---|---|---|
| Detection Signal Levels | φVdet:L φTdet:H | φVdet:L φTdet:L | φVdet:H φTdet:H | φVdet:H φTdet:L |
| Data Retention Time (ms) | 170 | 210 | 280 | 340 |
| Combination of Pulse Trains | Q2 + Q5 | Q3 + Q5 | Q0 + Q6 | Q3 + Q6 |
| Period of Master Clock φRd | 80 | 96 | 132 | 160 |
| Refresh Cycle Time (ms) | 163.8 | 196.6 | 270.3 | 160 |

Descriptions will now be given on the operations of the self-refresh period control circuit of FIG. 1 under the condition of the case 4 in Table 3, in which the voltage detection signal φVdet from the voltage detector 40 is the "high" level and the temperature detection signal φTdet from the temperature detector is the "low" level, respectively.

Referring back to FIG. 1, as going into the CBR mode, the timer driving signal φTmon changes to the "high" level and, accordingly, the timer 36 generates the pulse train φOSC. The frequency-divider 38 frequency-divides the pulse train φOSC to generate the pulse trains Q0–Q7, which are then applied to the pulse selector 44. Referring to FIG. 5, after a lapse of a predetermined time, for example 200 μsec, determined by the clock Qi, the memory device advances to the self-refresh mode at a time t0 when the self-refresh enable signal φsre from the self-refresh enable signal generator 18 goes to the "high" level. At this moment, as shown in FIG. 2, the signal φR maintains the "high" level according to the RAS signal activated to the "low" level. As a result, in the self-refresh mode, the signal φR, the self-refresh enable signal φsre and the timer driving signal φTmon are all maintained at the "high" level.

With reference to FIG. 4A, since the voltage detection signal φVdet is at the "high" level and the temperature detection signal φTdet is at the "low" level, only the output of the NAND gate 134 goes to the "low" level and the outputs from the remaining NAND gates 132, 136 and 138 are all at the "high" level. Accordingly, since only a combination pulse train Q3+Q6 output from the NAND gate 142 receiving the pulse trains Q3 and Q6 is valid and the other remaining combination pulse trains are all neglected, the signal φsrp output from the NAND gate 160 become the combination pulse train Q3+Q6. Therefore, the signal φsrp has the "high" level at a time between t1 and t2 at which the pulse trains Q3 and Q6 are simultaneously the "high" level.

The signal φsrp is changed to the self-refresh signal srfhp at the self-refresh signal generator 46 shown in FIG. 4B. In FIG. 4B, since the number of the serially connected inverters 162 is odd number (seven in FIG. 4B), the self-refresh signal srfhp maintaining the "low" level between the time t2 and the time t3 delayed by the inverters 162 is generated at the time t2 at which the signal φsrp changes from the "high" level to the "low" level.

Referring to FIG. 4C, since the signal φR and the self-refresh enable signal φsre are all maintained at the "high" level, the master clock generator 48 inverts the self-refresh signal srfhp to generate the master clock φRd.

It is well known in the art that the master clock φRd controls the RAS chain of the memory device, and internal addresses generated under the control of the master clock drives a selected one of 2,048 word lines. Such an operation is repeated for the every generation of the master clock to refresh the entire memory cells.

Referring to FIG. 6, since the self-refresh enable signal φsre and the timer driving signal φTmon maintain the "high" level, the reset signal φReset having the "low" level for the delay time by the serially connected inverters 202 is generated at a time t3 at which the self-refresh signal srfhp changes from the "low" level to the "high" level. Therefore, the frequency divider 38 shown in FIG. 1 is reset and, accordingly, the pulse trains Q0–Q7 output from the frequency divider 38 are all initialized to generate the pulse trains having the same states as those at the time t0.

The above described operations are repeated as long as the voltage detection signal φVdet and the temperature detection signal φTdet are at the "high" level and the "low" level, respectively. That is, the pulse trains Q0–Q7, the signal φsrp, the self-refresh signal srfhp and the master clock φRd are sequentially generated from the time t0 to the time t3 and thus, the second active pulse of the master clock φRd is generated at a time t4, repeatedly performing the same operation.

The time interval between the time t2 and the time t3 for which the master clock φRd is activated to the "high" level approximates to the random read/write cycle time $t_{RC}$ of the memory device. Thus, this time interval is negligible when compared with the total refresh operation time. Accordingly, a period of the master clock φRd defined as the time interval between the time t3 and the time t4 approximates to a period (160 μsec) of the combination pulse trains Q3+Q6. The time for which a selected one of the word lines is refreshed after a previous word line is refreshed, i.e., the refresh cycle time is 160×2,048≈327.7 msec. Thus, the refresh cycle time 327.7 msec satisfies the data retention time 340 msec of the memory cells.

In the voltage detector 40 of FIG. 3A, the "high" level is generated from the detection controller 114 every time when the self-refresh signal srfhp changes from the "low" level to the "high" level, so as to turn on the transfer gate 120 of the output stage 112. The output stage 112 generates a new voltage detection signal φVdet at the time when the self-refresh signal changes from the "low" level to the "high" level (i.e., when the master clock changes from the "high" level to the "low" level). In similar, the temperature detector 42 of FIG. 3B generates a new temperature detection signal at a time when the self-refresh signal srfhp changes from the "low" level to the "high" level.

Accordingly, the voltage detector 40 of FIG. 3A and the temperature detector 42 of FIG. 3B respectively detect the supply voltage and the ambient temperature at a time when the master clock φRd is inactivated to the "low" level after an activation of the "high" level. Thus, in the pulse train selector 44 of FIG. 4A, a selected one of the NAND gates 132, 134, 136 and 138 generates an output signal of the "low" level according to the new voltage detection signal φVdet and the new temperature detection signal φTdet, so that one of the four combination pulse trains is selected to generate the signal φsrp.

For example, in the course of the operation under the condition of the case 4, if the supply voltage is maintained constantly while the ambient temperature increases more and more, the voltage detection signal φVdet and the temperature detection signal φTdet are all at the "high" level, thereby advancing to a condition of the case 3 of Table 3. Under the condition of the case 3, in the pulse selector 44 of FIG. 4A, the NAND gate 138 generates the "low" level and the remaining NAND gates 132, 134 and 136 generate the "high" level, in response to the detection signals, thereby selecting the combination pulse train Q0+Q6 to generate the signal φsrp. Therefore, the period of the master clock φRd becomes 132 μsec which is the period of the combination pulse train Q0+Q6. Thus, the refresh cycle time is 132×2,048≈270.3 msec, thereby satisfying the data retention time of 280 msec under the case 3.

Operations under the conditions of the case 1 and case 2 also will be readily appreciated from the above descriptions concerning the case 4 and case 3.

As shown in Table 3, the self-refresh period control circuit according to the present invention can generate the combination pulse trains having variable periods, so that a master clock having a period approximating to the data retention time is generated. Therefore, the unnecessary self-refresh operations are prevented during the standby state, thus reducing the current consumptions.

Further, the self-refresh period control circuit according to the present invention automatically controls the self-refresh period according to the variations of the power supply voltage and the ambient temperature, so that the self-refresh operation may be optimized.

In the above mentioned embodiment, the period of the self-refresh operation was obtained by using the pulse selecting part shown in FIG. 4A. According to the another embodiment of the present invention, any one of the pulse trains provided from the divider can be selected, in response to the voltage detect signal and the temperature detect signal.

Further, the period of the self-refresh operation can be controlled by making the number of the voltage detecting part and the temperature detecting part various, in response to the closer changes of the temperature and the voltage.

What is claimed is:

1. A period control circuit for self-refresh operation in a semiconductor memory device comprising:

pulse generating means for outputting a predetermined periodic pulse train in response to an external control signal;

frequency-dividing means for outputting a plurality of pulse trains which have different periods from each other by frequency-dividing said pulse train output from said pulse generating means;

at least one temperature detecting means for detecting an ambient temperature of said memory device and for outputting a temperature detection signal when said ambient temperature reaches a predetermined level;

at least one voltage detecting means for detecting a power supply voltage applied to said memory device and for outputting a voltage detection signal when said power supply voltage reaches a predetermined level; and pulse selecting means for outputting a self-refresh master clock by selecting one of said pulse trains in response to said voltage detection signal and said temperature detection signal.

2. A period control circuit for self-refresh operation in a semiconductor memory device comprising:

pulse generating means for outputting a predetermined periodic pulse train in response to an external control signal;

frequency-dividing means for outputting a plurality of pulse trains which have different periods from each other by frequency-dividing said pulse train output from said pulse generating means;

at least one temperature detecting means for detecting an ambient temperature of said memory device and for outputting a temperature detection signal when said ambient temperature reaches a predetermined level;

at least one voltage detecting means for detecting a power supply voltage applied to said memory device and for outputting a voltage detection signal when said power supply voltage reaches a predetermined level;

combination pulse train generating means for outputting a plurality of combination pulse trains by combining said pulse trains output from said frequency-dividing means; and pulse selecting means for outputting a self-refresh master clock by selecting one of said combination pulse trains in response to said voltage detection signal and said temperature detection signal.

3. A circuit for controlling a self-refresh period of a semiconductor memory device, comprising:

a pulse generating circuit which outputs a periodic pulse train in response to an external control signal;

a frequency-dividing circuit which outputs a plurality of pulse trains having different periods from each other by frequency-dividing said periodic pulse train output by said pulse generating circuit;

a temperature detection circuit which detects an ambient temperature of said memory device and outputs a temperature detection signal when said ambient temperature reaches a predetermined temperature level;

a voltage detection circuit which detects a power supply voltage applied to said memory device and outputs a voltage detection signal when said power supply voltage reaches a predetermined voltage level; and, a pulse selection circuit which outputs a self-refresh master clock by selecting one of said pulse trains in response to said temperature detection signal and said voltage detection signal.

4. A circuit for controlling a self-refresh period of a semiconductor memory device, comprising:

a pulse generating circuit which outputs a periodic pulse train in response to an external control signal;

a frequency-dividing circuit which outputs a plurality of pulse trains having different periods from each other by frequency-dividing said periodic pulse train output by said pulse generating circuit;

a temperature detection circuit which detects an ambient temperature of said memory device and outputs a temperature detection signal when said ambient temperature reaches a predetermined temperature level;

a voltage detection circuit which detects a power supply voltage applied to said memory device and outputs a voltage detection signal when said power supply voltage reaches a predetermined voltage level;

a combination pulse train generating circuit which outputs a plurality of combination pulse trains by variously combining said pulse trains output by said frequency-dividing means;

a pulse selection circuit which outputs a self-refresh master clock by selecting one of said combination pulse trains in response to said temperature detection signal and said voltage detection signal.

* * * * *